US010211304B2

(12) United States Patent
Losee et al.

(10) Patent No.: US 10,211,304 B2
(45) Date of Patent: Feb. 19, 2019

(54) SEMICONDUCTOR DEVICE HAVING GATE TRENCH IN JFET REGION

(71) Applicant: General Electric Company, Schenectady, NY (US)

(72) Inventors: Peter Almern Losee, Clifton Park, NY (US); Alexander Viktorovich Bolotnikov, Brooklyn, NY (US)

(73) Assignee: General Electric Company, Schenectady, NY (US)

( * ) Notice: Subject to any disclaimer, the term of this patent is extended or adjusted under 35 U.S.C. 154(b) by 1022 days.

(21) Appl. No.: 14/097,075

(22) Filed: Dec. 4, 2013

(65) Prior Publication Data
US 2015/0155355 A1 Jun. 4, 2015

(51) Int. Cl.
*H01L 29/423* (2006.01)
*H01L 29/16* (2006.01)
(Continued)

(52) U.S. Cl.
CPC ...... *H01L 29/4236* (2013.01); *H01L 29/1608* (2013.01); *H01L 29/66068* (2013.01); *H01L 29/66704* (2013.01); *H01L 29/66712* (2013.01); *H01L 29/66719* (2013.01); *H01L 29/66734* (2013.01); *H01L 29/7813* (2013.01); *H01L 29/7832* (2013.01); *H01L 23/544* (2013.01); *H01L 29/045* (2013.01);
(Continued)

(58) Field of Classification Search
CPC ............. H01L 29/1066; H01L 29/8083; H01L 29/0623; H01L 29/1037; H01L 29/1095; H01L 29/1608; H01L 29/4236; H01L 29/42368; H01L 29/42376; H01L 29/66734; H01L 29/7813; H01L 29/7832; H01L 29/66704; H01L 29/66712
See application file for complete search history.

(56) References Cited

U.S. PATENT DOCUMENTS 5,679,966 A * 10/1997 Baliga ................. H01L 29/7391
257/139
5,701,023 A * 12/1997 Bulucea .............. H01L 29/7808
257/139

(Continued)

OTHER PUBLICATIONS

Majumdar, "Studies on the Effect of Channel Implantation on the Drain Current of a Grooved-Gate MOSFET", International Journal of Electronics, vol. 81, Issue 2, pp. 137-148, 1996.

(Continued)

*Primary Examiner* — Michael Jung
(74) *Attorney, Agent, or Firm* — GE Global Patent Operation; John Darling

(57) ABSTRACT

The subject matter disclosed herein relates to metal-oxide-semiconductor (MOS) devices, such as silicon carbide (SiC) power devices (e.g., MOSFETs, IGBTs, etc.). A semiconductor device includes a well region extending a first depth into a surface of an epitaxial semiconductor layer positioned above a drift region. The device includes a junction field-effect transistor (JFET) region positioned adjacent to the well region in the epitaxial semiconductor layer. The device also includes a trench extending a second depth into the JFET region, wherein the trench comprises a bottom and a sidewall that extends down to the bottom at an angle relative to the surface of the epitaxial semiconductor layer.

18 Claims, 11 Drawing Sheets

(51) Int. Cl.
*H01L 29/78* (2006.01)
*H01L 29/66* (2006.01)
*H01L 29/10* (2006.01)
*H01L 29/417* (2006.01)
*H01L 23/544* (2006.01)
*H01L 29/04* (2006.01)
*H01L 29/06* (2006.01)

(52) U.S. Cl.
CPC ...... *H01L 29/0623* (2013.01); *H01L 29/1037* (2013.01); *H01L 29/1095* (2013.01); *H01L 29/41766* (2013.01); *H01L 29/42368* (2013.01); *H01L 29/42376* (2013.01); *H01L 2223/54426* (2013.01); *H01L 2223/54453* (2013.01); *H01L 2924/0002* (2013.01)

(56) References Cited

U.S. PATENT DOCUMENTS

| | | | |
|---|---|---|---|
| 7,498,633 | B2 | 3/2009 | Cooper et al. |
| 7,935,561 | B2 | 5/2011 | Park |
| 8,193,564 | B2 | 6/2012 | Suzuki et al. |
| 8,350,317 | B2 | 1/2013 | Kocon |
| 2002/0056872 | A1* | 5/2002 | Baliga .................. H01L 23/552 257/330 |
| 2005/0205931 | A1* | 9/2005 | Mouli ................. H01L 27/1203 257/347 |
| 2008/0230787 | A1* | 9/2008 | Suzuki ............... H01L 29/0623 257/77 |
| 2009/0146154 | A1* | 6/2009 | Zhang .................. H01L 29/045 257/77 |
| 2010/0301410 | A1* | 12/2010 | Hirler ................. H01L 29/7813 257/334 |
| 2011/0018004 | A1 | 1/2011 | Shimizu et al. |
| 2012/0161154 | A1 | 6/2012 | Mimura et al. |
| 2012/0217540 | A1 | 8/2012 | Hirler |
| 2012/0280255 | A1* | 11/2012 | Masuda ................ H01L 21/049 257/77 |
| 2014/0159141 | A1* | 6/2014 | Arthur ............. H01L 29/42368 257/329 |
| 2015/0084125 | A1* | 3/2015 | Pala .................. H01L 21/26506 257/334 |
| 2015/0097226 | A1* | 4/2015 | Lichtenwalner .... H01L 29/4925 257/329 |

OTHER PUBLICATIONS

Juanga et al., "Fabrication of Trench-Gate Power MOSFETs by using a Dual Doped Body Region", Elsevier—Solid State Electronics, vol. 48, Issue 7, pp. 1079-1085, Jul. 2004.

Rakesh et al., "Novel Power VDMOSFET Structure with Vertical Floating Islands and Trench Gate", Indian Journal of Pure & Applied Physics, vol. 43, pp. 301-307, Apr. 2005.

Harada et al., "1.8 mΩcm2, 10 A Power MOSFET in 4H-SiC", Electron Devices Meeting, International IEDM '06, pp. 01-04, Dec. 11-13, 2006, Location: San Francisco, CA.

Nakamura et al., "High performance SiC trench devices with ultra-low Ron", Electron Devices Meeting (IEDM) IEEE International, Dec. 2011.

Zhang et al., "4H-SiC Trench Schottky Diodes for Next Generation Products", Materials Science Forum, Jan. 2013, pp. 781-784, vol. 740-742.

Harada et al., "Determination of optimum structure of 4H-SiC trench MOSFET", IEEE ISPSD, Jun. 2012.

Takaya et al., "4H-SiC trench MOSFET with thick bottom oxide", Materials Science Forum, Jan. 2013, pp. 683-686, vol. 740-742.

Miyahara et al., "Effect of damage removal treatment after trench etching on the reliability of trench MOSFETs", Materials Science Forum, Jan. 2013, pp. 789-792, vol. 740-742.

Banzhaf et al., "Characterization of diverse gate oxides on 4H-SiC 3D trench-MOS structures", Materials Science Forum, Jan. 2013, pp. 691-694, vol. 740-742.

Biscarrat et al., "ICP etching of 4H-SiC substrate", Materials Science Forum, Jan. 2013, pp. 825-828, vol. 740-742.

Chu et al., (Tsing Hua Univ, Diodes Inc.), An Improvement of Trench Profile of 4H-SiC Trench MOS Barrier Schottky (TMBS) Rectifier, Materials Science Forum, Jan. 2013, pp. 687-690, vol. 740-742.

Nakano et al., "4H-SiC Trench Metal Oxide Semiconductor Field Effect Transistors with Low On-Resistance", Japanese Journal of Applied Physics, Apr. 20, 2009.

\* cited by examiner

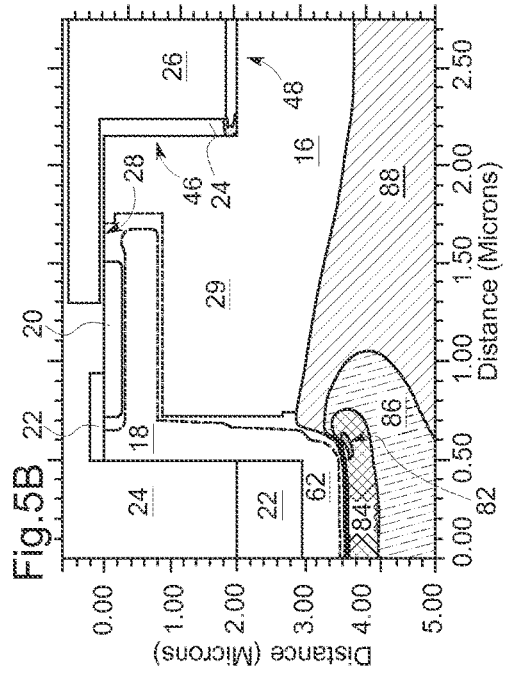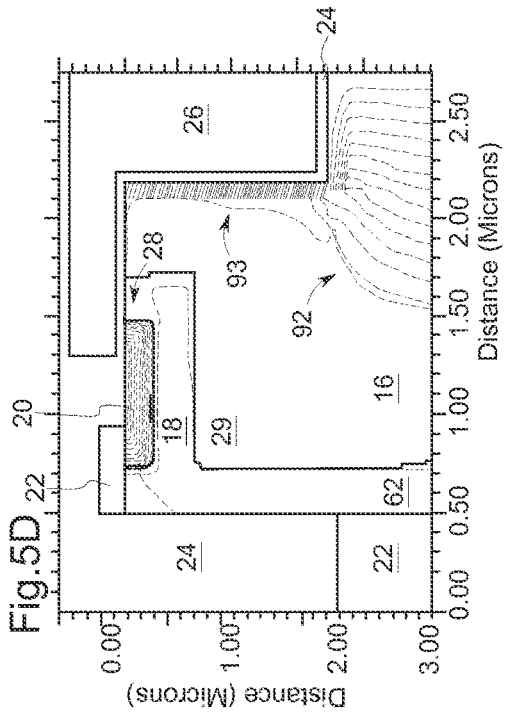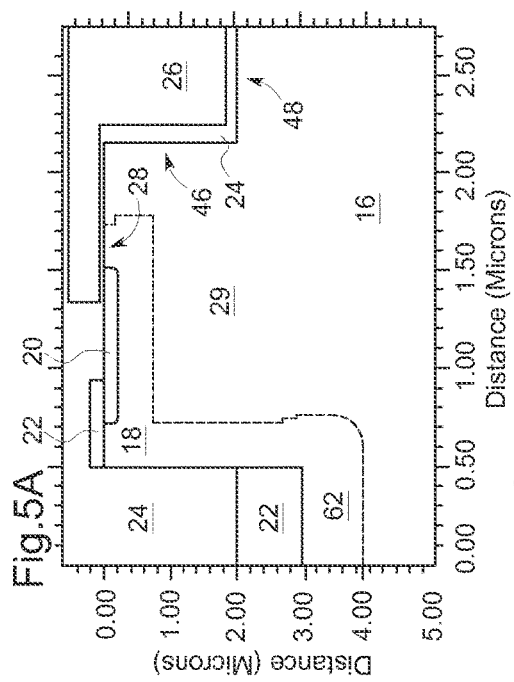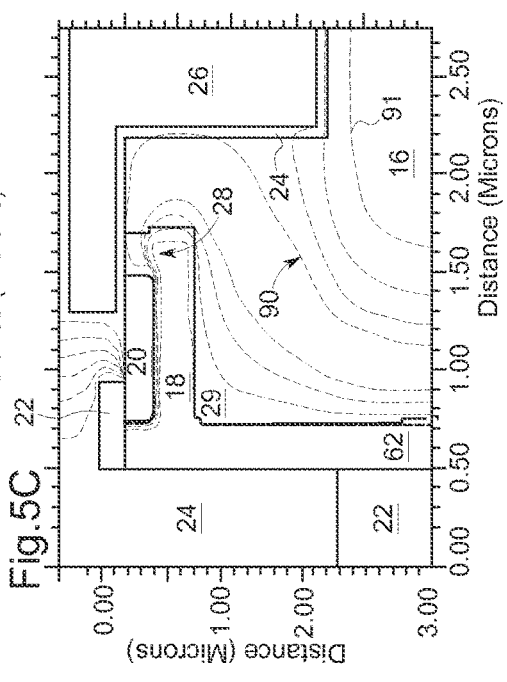

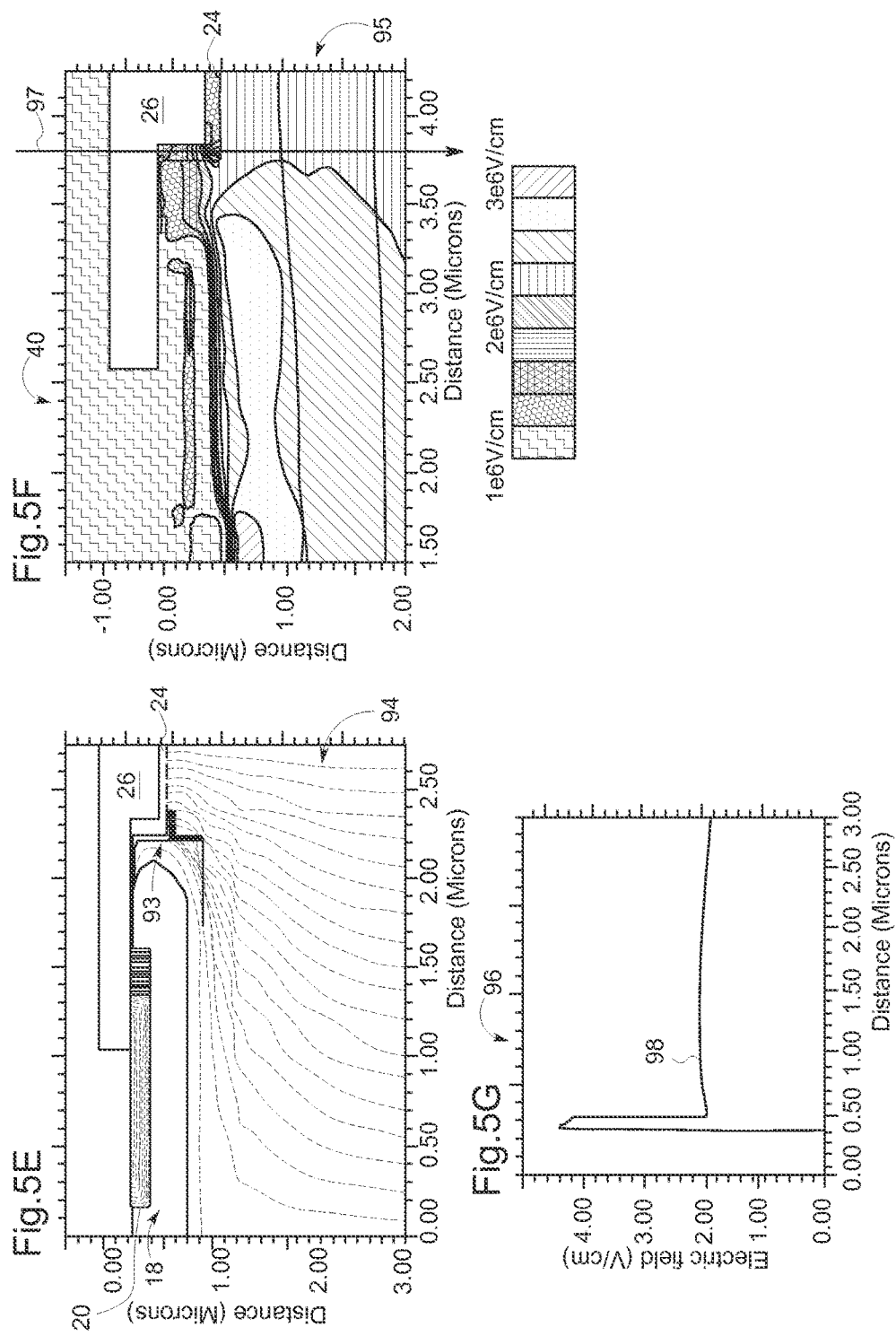

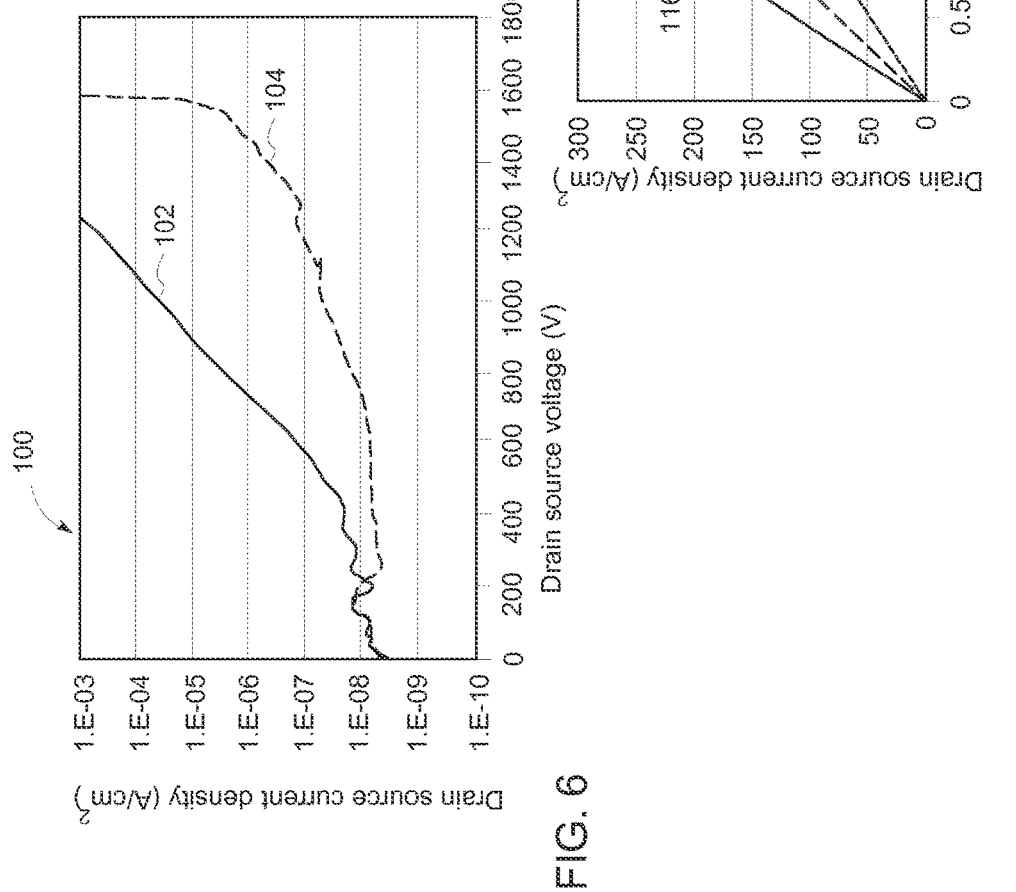

SEMICONDUCTOR DEVICE HAVING GATE TRENCH IN JFET REGION

BACKGROUND

The subject matter disclosed herein relates to metal-oxide-semiconductor (MOS) devices, such as silicon carbide (SiC) power devices (e.g., MOSFETs, IGBTs, etc.).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Power electronics systems widely use modern power devices to convert electrical power from one form to another form for consumption by a load. Many power electronics systems utilize various semiconductor devices and components, such as thyristors, diodes, and various types of transistors (e.g., metal-oxide-semiconductor field-effect transistor (MOSFETs), junction gate field-effect transistor (JFETs), insulated gate bipolar transistors (IGBTs), and other suitable transistors), in this power conversion process.

Specifically for high-voltage and/or high-frequency and/or high-current applications, devices utilizing wide bandgap semiconductors, such as silicon carbide (SiC), aluminum nitride (AlN), gallium nitride (GaN), etc., may afford a number of advantages in terms of high temperature operation, reduced ON-resistance, and smaller die size than corresponding silicon (Si) devices. Accordingly, wide bandgap semiconductor devices offer advantages to power conversion applications including, for example, power distribution systems (e.g., in electrical grids), power generation systems (e.g., in solar and wind converters), as well as consumer goods (e.g., electric vehicles, appliances, power supplies, etc.). However, the differences between SiC and Si material systems, for example, can cause certain processes (e.g., device designs and/or manufacturing processes) that work well for Si devices to be unsuitable for corresponding SiC semiconductor devices, and vice versa. Accordingly, in addition to their benefits, wide-bandgap semiconductor materials also present challenges during device design and fabrication.

BRIEF DESCRIPTION

Certain embodiments commensurate in scope with the originally claimed subject matter are summarized below. These embodiments are not intended to limit the scope of the claimed invention, but rather these embodiments are intended only to provide a brief summary of possible forms of the invention. Indeed, the present disclosure may encompass a variety of forms that may be similar to or different from the embodiments set forth below.

In one embodiment, a semiconductor device includes a well region extending a first depth into a surface of an epitaxial semiconductor layer positioned above a drift region. The device includes a junction field-effect transistor (JFET) region positioned adjacent to the well region in the epitaxial semiconductor layer. The device also includes a trench extending a second depth into the JFET region, wherein the trench comprises a bottom and a sidewall that extends down to the bottom at an angle relative to the surface of the epitaxial semiconductor layer.

In another embodiment, a semiconductor device includes a trench extending a depth into a JFET region of an epitaxial semiconductor layer of the semiconductor device, wherein the trench has a sidewall that extends down from a surface of the epitaxial layer at a constant or variable angle. Additionally, at least a portion of the sidewall and bottom of the trench are configured to accumulate carriers when the semiconductor device is in an ON-state. The device includes a dielectric layer positioned along the sidewall of the trench and a gate electrode positioned on top of the dielectric layer and at least partially extending into the trench. The device also includes a channel region positioned near the trench, wherein the trench and the gate electrode are configured to shield the channel region from drain-induced barrier lowering (DIBL) effects when the semiconductor device is in a blocking state.

In another embodiment, a method of manufacturing a semiconductor device includes etching a trench into a first portion of an epitaxial semiconductor layer at a first depth, wherein the trench includes a bottom and a sidewall that extends down to the bottom at a constant or variable angle relative a surface of the epitaxial semiconductor layer. The method includes forming a well that extends a second depth into a second portion of the epitaxial semiconductor layer disposed near the trench. The method also includes forming a trench shield by doping a portion of the epitaxial semiconductor layer adjacent to the well, which may prevent high electric fields from reaching the dielectric in or around the trench bottom and sidewalls. The method further includes forming a dielectric layer along a surface of the sidewall and bottom of the trench and over at least a portion of the well, wherein the dielectric layer has a thickness of at least 30 nm. The method further includes forming a gate electrode over the dielectric layer, wherein the gate electrode extends at least partially into the trench.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 5A is a simulated cross-sectional view of an embodiment of a TDMOSFET device;

FIG. 5B is a simulated cross-sectional view of the TDMOSFET device of FIG. 5A in a blocking state;

FIG. 5C is a simulated cross-sectional view of the TDMOSFET device of FIG. 5A in an OFF state;

FIG. 5D is a simulated cross-sectional view of the TDMOSFET device of FIG. 5A in an ON state;

FIG. 5E is a simulated cross-sectional view of another embodiment of a TDMOSFET device in an ON state;

FIG. 5F is a simulated cross-sectional view of the TDMOSFET device of FIG. 5E in a blocking state;

FIG. 5G is a graph illustrating electric field strength though a portion of the embodiment of the TDMOSFET device of FIG. 5F;

FIG. 6 is a graph illustrating simulated I-V characteristics (i.e., leakage current density as a function of drain-source bias ($V_{DS}$)) for the planar MOSFET of FIG. 1 and an embodiment of a TDMOSFET device;

FIG. 7 is a graph illustrating simulated I-V characteristics (i.e., drain-source current density as a function of $V_{DS}$) for the planar MOSFET of FIG. 1, for an embodiment of a TDMOSFET device having the same pitch, and for an embodiment of a TDMOSFET device having an optimized cell;

DETAILED DESCRIPTION

Figure 1:
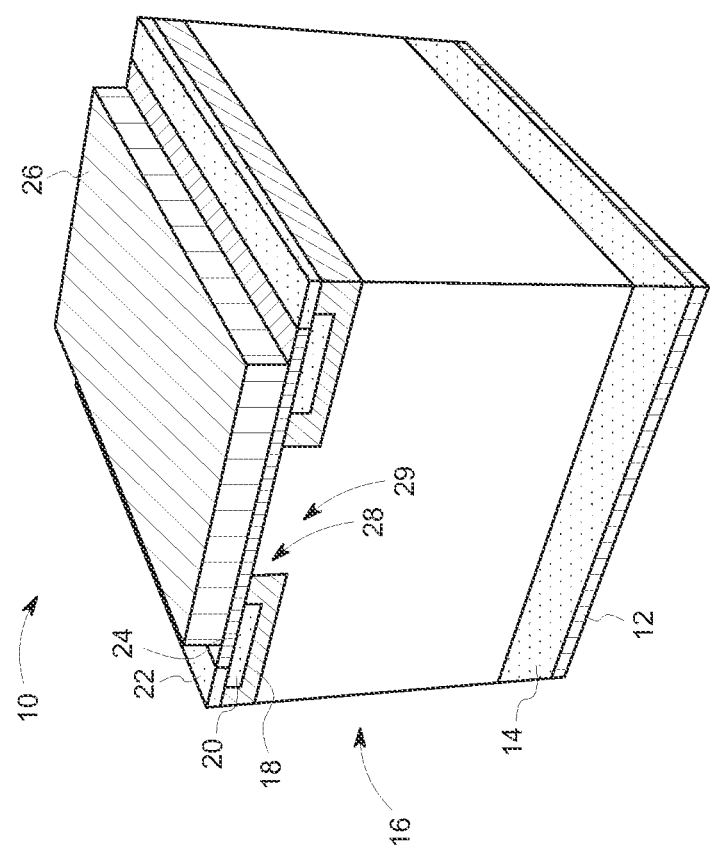
FIG. 1 is a schematic of a typical planar metal-oxide-semiconductor field-effect transistor (MOSFET) device.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

For certain types of semiconductor devices, such as silicon carbide (SiC) double-diffused or double-implanted metal-oxide-semiconductor field-effect transistors (DMOSFETs), it may be generally desirable to achieve a device that has a low specific ON-resistance ($R_{ON,sp}$) and a high blocking voltage (BV). Further, it may be appreciated that some types of MOSFET devices (e.g., SiC MOSFET devices) generally have a lower inversion layer carrier mobility and, thus, a higher channel resistance than similar silicon MOSFET devices. It may, therefore, be specifically desirable to design MOSFET devices (e.g., SiC MOSFET devices) with a lower $R_{ON,sp}$ by minimizing (e.g., reducing, limiting, or lessening) resistance of the channel component of the MOSFET. Accordingly, semiconductor designs have moved toward shorter and shorter channel lengths (e.g., 0.5 μm or less) in order to reduce $R_{ON,sp}$ and to reduce device pitch, which leads to a higher cell density. As such, certain semiconductor device designs may generally be constrained by a tradeoff between $R_{ON,sp}$ and Drain-Induced-Barrier Lowering (DIBL) effects as ever shorter channels are employed. For example, in certain semiconductor devices, reducing channel lengths ($L_{CH}$) generally involves the use of increased surface doping (e.g., p-type surface doping) in order to mitigate DIBL effects when the semiconductor device is in the OFF state. However, this increased surface doping may also result in increased threshold voltage ($V_T$) and reduced mobility, which diminishes the advantages of the shorter channel in reducing $R_{ON,sp}$.

With the foregoing in mind, present embodiments are directed toward trench-gate DMOSFET (TDMOSFET) designs that afford performance and reliability advantages compared to conventional planar DMOSFET as well as U-shaped MOSFET (UMOSFET) approaches. In particular, present embodiments enable the manufacture of semiconductor devices for which the blocking voltage (BV) is not limited by the aforementioned DIBL effects, even for very short channel lengths (e.g., less than 0.5 μm and generally limited only by process technology). Further, the presently disclosed TDMOSFET designs enable lower leakage currents at elevated temperatures (e.g., at or above 150° C.) and lower gate-drive voltages (e.g., $V_{GS}$ less than 20V). By specific example, the presently disclosed TDMOSFET design embodiments are capable of reducing the on-resistance of typical MOSFETs by 2-3× at operating temperatures greater than 150° C. Additionally, present embodiments enable a lower capacitance semiconductor device (e.g., lower input capacitance ($C_{iss}$), output capacitance ($C_{oss}$), and reverse transfer capacitance ($C_{rss}$)), which may also provide improved transient characteristics when compared to a planar DMOSFET of similar BV/ON-resistance. The presently disclosed TDMOSFET design may also operate at lower electric fields in gate dielectric layer when compared to conventional DMOSFETs and UMOSFET structures, which may enable improved device performance and reliability. Further, the presently disclosed TDMOSFET design may be used in combination with different cell designs and layouts (e.g., stripe, ladder, square, rectangular, hexagonal, and so forth) as well as certain non-planar device designs having repeating trench structures (e.g., oriented generally parallel to $L_{CH}$) for additional performance gains. Additionally, as set forth below, certain embodiments of the present approach may include features (e.g., a thicker dielectric layer) to enable the manufacture of a radiation hardened semiconductor device (e.g., radiation hardened against single event gate rupture failures) such as may be useful for space applications and/or offer better reliability against failure due to terrestrial cosmic or high-energy radiation events.

It may be appreciated that the presently disclosed designs may be applicable to reducing $R_{ON,sp}$ while limiting DIBL effects any type of MOS-gated and/or MOS-controlled semiconductor devices (e.g., MOSFETs, insulated gate bipolar transistors (IGBTs), Insulated Base MOS-Controlled Thyristor (IBMCT), Base Resistance MOS-Controlled Thyristor (BRT), etc.). Further, this structure may be used in combination with charge-balance based or super-junction based device (e.g., switches, FETs, diodes, and so forth). It should also be appreciated that, while the MOSFET devices presented herein may be illustrated and discussed as having certain types of doping (e.g., p- or n-doping) in various layers or regions (e.g., p-doping to form p-wells), in other embodiments, MOSFET devices having opposite doping (e.g., n-doping to form n-wells, and n-channel, and so forth) may also be used without negating the effect of the present approach. It should be noted that, while the device embodiments discussed below are presented as SiC devices, these are merely provided as examples. In other embodiments, semiconductor devices may be manufactured from silicon (Si), germanium (Ge), aluminum nitride (AlN), gallium nitride (GaN), gallium arsenide (GaAs), diamond (C), or any other semiconductor material without negating the effect of the present approach.

With the foregoing in mind, FIG. 1 illustrates an active cell of a planar n-channel field-effect transistor, namely a DMOSFET, hereinafter MOSFET device 10. It may be appreciated that, in order to more clearly illustrate certain components of the MOSFET device 10, as well as other devices discussed below, certain commonly understood design elements (e.g., top metallization, passivation, edge termination, and so forth) may be omitted. The illustrated MOSFET device 10 of FIG. 1 includes a drain contact 12 disposed on the bottom of the device, below an n-type substrate layer 14. Above the substrate layer 14, an n-type drift layer 16 is disposed. Near the surface of the MOSFET device 10, p-well 18 (e.g., well region 18) and an n+ region 20 are situated below a source contact 22. Further, a dielectric layer 24 isolates a gate 26 from the n+ region 20 and the p-well 18. During operation, an appropriate gate voltage (e.g., at or beyond a threshold voltage ($V_{TH}$) of the MOSFET device 10) may cause an inversion layer to form in the channel region 28, as well as a conductive path to form or be enhanced in the junction field-effect transistor (JFET) region 29 due to accumulation of carriers, allowing current to flow between the source contact 22 and the drain contact 12. It should be appreciated that, for the MOSFET devices discussed herein, the channel region 28 may be generally defined as part of p-well region 18 that is positioned below the interface between the p-well region 18 and the gate dielectric 24.

Figure 2:
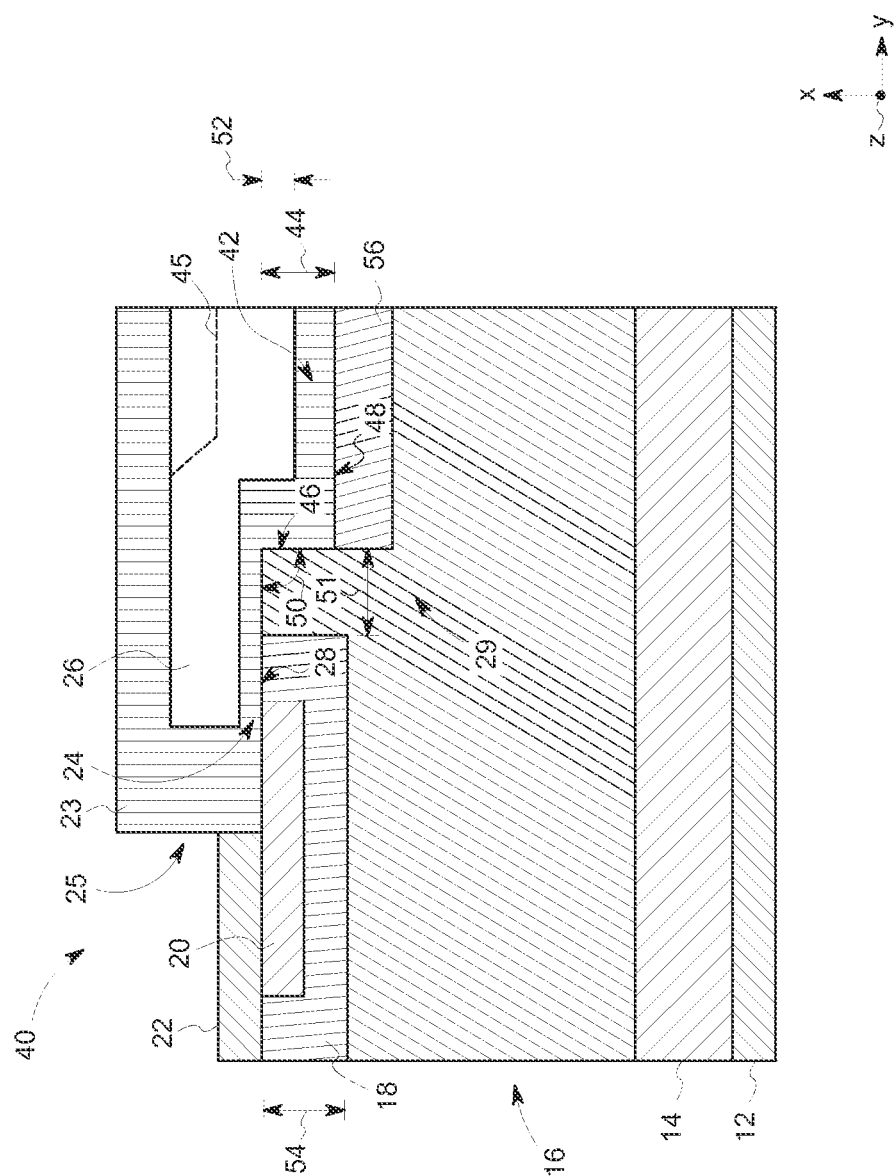
FIG. 2 is a schematic cross-sectional view of an embodiment of a trench-gate MOSFET (TDMOSFET) device.

FIG. 2 illustrates a trench-gate (TDMOSFET) device 40 in accordance with an embodiment of the present approach. The illustrated TDMOSFET device 40 includes certain similar features to the planar DMOSFET 10 described above (e.g., a drain contact 12, a n-type substrate layer 14, a p-well 18, a n+ region 20, and a source contact 22). However, unlike DMOSFET 10, the TDMOSFET device 40, the JFET region 29 of the device includes a trench 42 that extends a distance 44 into the surface of the semiconductor substrate. The trench 42 of the illustrated TDMOSFET device 40 includes a sidewall 46 that extends from a bottom 48 of the trench 42 at a particular angle 50. In certain embodiments, the angle 50 may be any angle between approximately 70° and approximately 135° (e.g., 70°, 75°, 80°, 85°, 90°, 95°, 100°, 105°, 110°, 115°, 120°, 125°, 130°, or 135°). In other embodiments, the angle may be measured or determined as the angle between the sidewall 46 and the surface of the epitaxial layer rather than the bottom 48 of the trench 42. In certain embodiments, the angle 50 may be substantially perpendicular (e.g., approximately 90°) to provide a trench 42 having a substantially vertical sidewall 46. In other embodiments, the sidewall 46 may not be straight. For example, in certain embodiments, the angle 50 may be a varying angle over the length of the sidewall 46, so as to impart a curved or "U" shaped surface to the sidewall 46. In still other embodiments, the trench 42 may have a "V" shape and, as such, may only include sidewall 46 and not bottom 48. Additionally, it may be appreciated that, for certain embodiments, the distance separating the p-well 18 and the sidewall 46 of the trench 42 generally defines the width 51 of the JFET region 29, while for other devices (discussed below) the width 51 of the JFET region 29 may be defined as the distance separating the p-wells 18 of a particular cell.

As illustrated in FIG. 2, a dielectric 23 (e.g., including a gate dielectric region 24 and an interlevel dielectric 25) is disposed about the gate 26 to electrically insulate the gate 26 from the remainder of the illustrated structure. Accordingly, a portion of the gate dielectric 24 is disposed within the trench 42 and electrically isolates the sidewall 46 and bottom 48 of the trench 42 from the portion of the gate 26 that protrudes a distance 52 downwards into the trench 42 and into the JFET region 29 of the device. In certain embodiments, the portion of the gate dielectric 24 near the sidewall 46 and/or the bottom 48 of the trench 42 may have a thickness of approximately between approximately 30 nm and approximately 150 nm (e.g., 30 nm, 40 nm, 50 nm, 60 nm, 70 nm, 80 nm, 90 nm, 100 nm, 110 nm, 120 nm, 130 nm, 140 nm, or 150 nm). For embodiments of the TDMOSFET device 40 that are hardened for radiation exposure (e.g., for use in applications involving operating in environments with high-energy radiation), the portion of the gate dielectric 24 near the sidewall 46 and/or the bottom 48 of the trench 42 gate dielectric 24 may be thicker, such as between approximately 30 nm and 500 nm (e.g., 75 nm, 100 nm, or 500 nm). In certain embodiments, the portion of the dielectric layer 24 disposed along the trench 42 may have a thickness that is two to ten times greater than a thickness of the dielectric layer 24 that is disposed over the channel region 28 of the TDMOSFET device 40. Additionally, in certain embodiments, the portion of the dielectric 23 (e.g., a portion of the interlevel dielectric 25) disposed near the source contact 22 may have a thickness that is at least 20% greater than the thickness of the dielectric layer 24 that is disposed over the channel region 28 of the TDMOSFET device 40.

As illustrated in FIG. 2, it may be appreciated that the depth 44 of the trench 40 as well as the distance 52 that the gate 26 extends into the trench 42 may, in certain embodiments, be selected relative to a depth 54 that the p-well 18 extends into the surface of the epitaxial drift layer 16. For example, in certain embodiments, the trench 42 may have a depth 44 that is greater than, less than, or equal to the depth 54 of the p-well 18 in order to control the shape of the potential contours and current flows within the TDMOSFET device 40 during operation, as discussed in greater detail below. It may also be appreciated that, in certain embodiments, the gate 26 may include a non-planar top surface, as illustrated by the dashed lines 45. That is, the dashed lines 45 indicate a portion of the gate 26 that, in certain embodiments, may be non-planar (e.g., due to the non-planarity of the SiC surface). For example, the gate 26 may have a trapezoidal or bowl shape in the top surface of the gate 26 after formation as a result of particular manufacturing methods, discussed below.

Additionally, as illustrated in FIG. 2, in certain embodiments the TDMOSFET device 40 may include a gate shield or gate shield region 56 positioned at the bottom 48 of the trench 42. This gate shield 56 may be a doped region (e.g., a P doped region that is depleted at $V_B$, which is breakdown voltage of the semiconductor) that may generally help to shield the gate dielectric 24 from electric fields present near the sidewall 46 and the bottom 48 of the trench 42 during operation of the device 40. However, in certain embodiments, the gate shield 56 may not be used when certain dimensions of the TDMOSFET device 40 (e.g., the depth 44 of the trench 42, the depth 54 of the well region 18, the distance 52 that the gate 26 extends into the trench 42, and so forth) are optimized in a manner that limits the strength of these electric fields near the gate dielectric 24 to be below approximately 5 megavolts per centimeter (MV/cm), or below a percentage below a break-down voltage of the gate dielectric 24 (e.g., <50% $E_{Dielectric-Breakdown}$), during operation of the device 40. In certain embodiments, the gate shield 56 may be continuous or segmented (e.g., along the Z axis). Additionally, in certain embodiments, the gate shield 56 may be electrically coupled to the source via the p-well 18 and body contacts to improve performance, while in other embodiments the gate shield 56 may be left floating to simplify the manufacturing process. In the latter case, it may be appreciated that the doping of the gate shield 56 may be as high as that of the p-well region 18 or a p+ region (e.g., a body contact region, not shown). In addition to the illustrated trench 42, in other embodiments, JFET doping or Current Spreading Layer (CSL) doping may be used, in which a doped region (e.g., between approximately 1× and approximately 10× the doping of the N-drift layer 16) may be disposed below the p-wells 18 and/or in the JFET region 51 to further improve device performance without spoiling the effect of the present approach.

Figure 3:
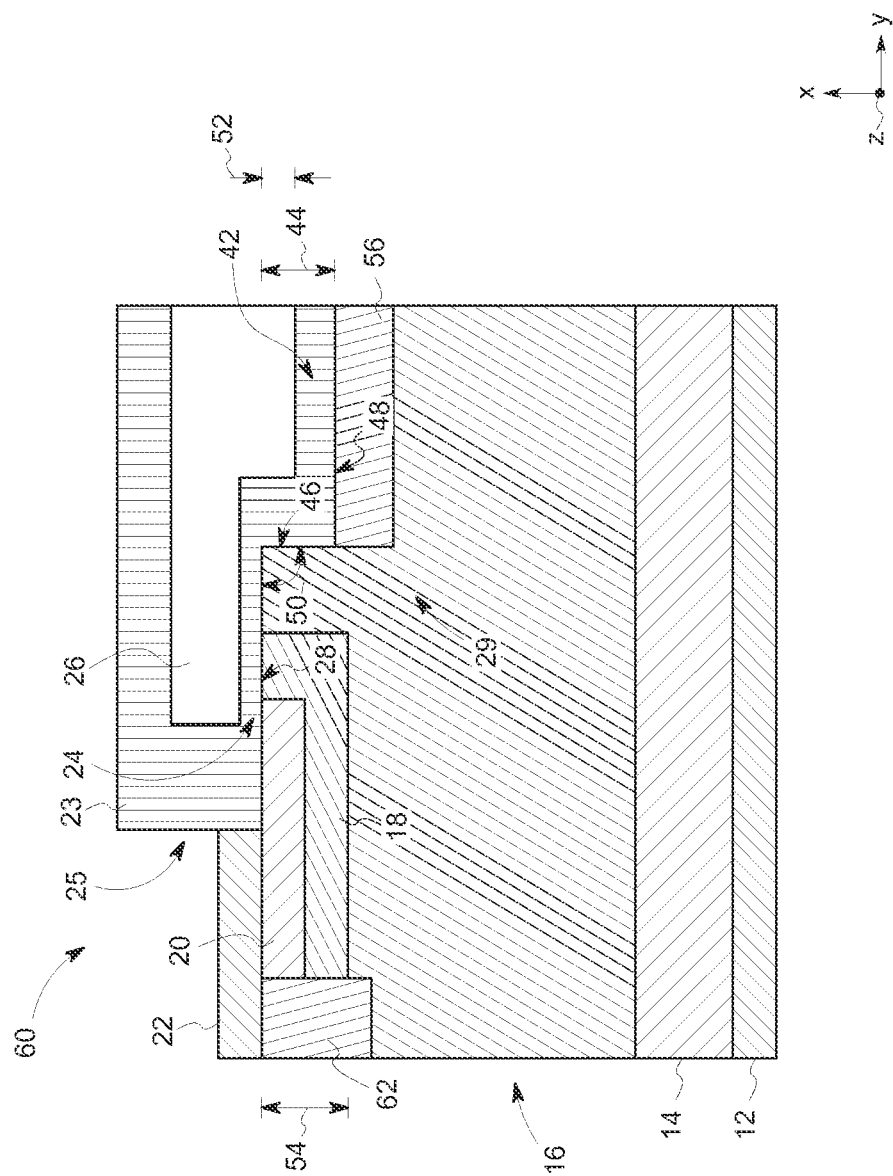
FIG. 3 is a schematic cross-sectional view of another embodiment of a TDMOSFET device.

FIG. 3 illustrates another TDMOSFET device 60, in accordance with an embodiment of the present approach. The illustrated the TDMOSFET device 60 includes similar features to the TDMOSFET device 40 described above. Like the TDMOSFET device 40, the JFET region 29 of the TDMOSFET device 60 illustrated in FIG. 3 includes a trench 42 that extends a distance 44 into semiconductor surface. Further, the TDMOSFET 60 also includes the gate dielectric 24 that electrically isolates the gate 26 from the sidewall 46 and the bottom 48 of the trench 42. However, in addition to the gate shield 56 discussed above, the illustrated TDMOSFET device 60 also includes a trench shield or trench shield region 62. Similar to the gate shield 56, this trench shield 62 is a doped region (e.g., a P+ doped region) that may generally shield the JFET region 29 and the gate dielectric 24 of the device 60 from electric fields generated during OFF-state operation. In other words, the trench shield 62 is a doped region that prevents high electric fields from reaching the dielectric in or around the trench bottom 48 and sidewalls 46. However, in certain embodiments, the trench shield 62 may not be used when the cells are suitably close to one another to limit the strength of these electric fields near the JFET region 29 (e.g., in the portion of the gate dielectric 24 disposed above or over the JFET region 29) of the TDMOSFET device 60. In certain embodiments, the trench shield 62 may be continuous or may be segmented (e.g., along the Z axis) to reduce overall JFET resistance of the TDMOSFET device 60. Furthermore, in certain embodiments, the trench shield 62 may be formed by first etching an additional trench in the surface of the epitaxial layer 16 and then implanting P+ dopant into the bottom and sidewalls of this additional trench to form the trench shield 62. In other embodiments, the trench shield 62 may be formed by deeply implanting P+ from the surface of the epitaxial layer 16 without the formation of this additional trench.

Figure 4:
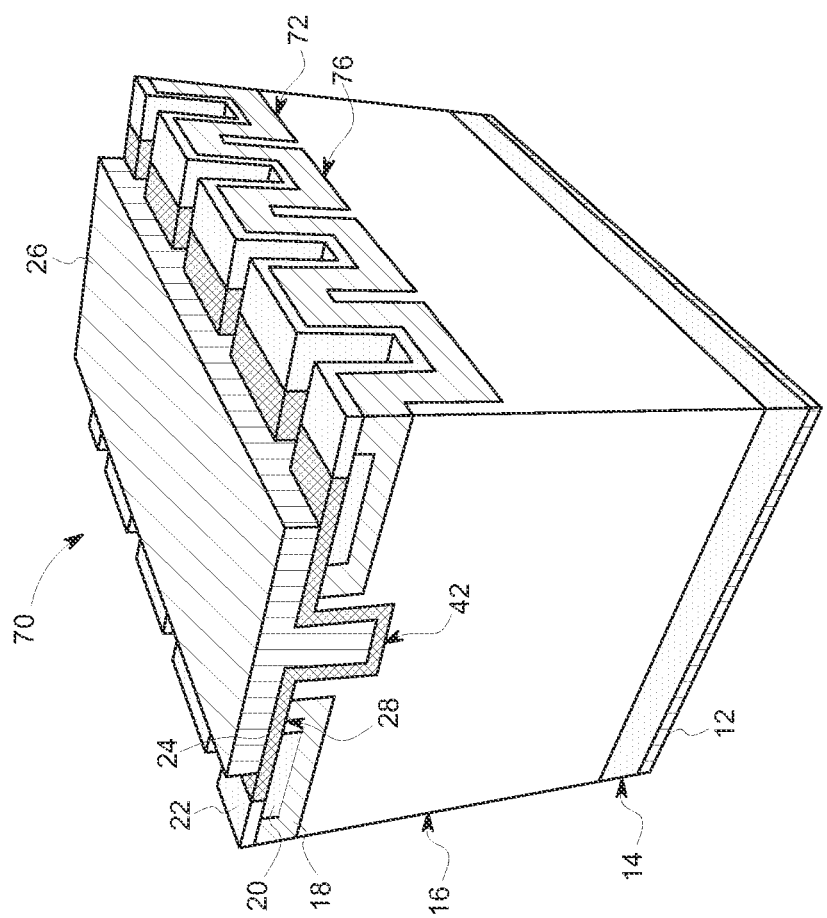
FIG. 4 is a schematic of a TDMOSFET device having rectangular trenches disposed substantially orthogonal to the trench-gate, in accordance with an embodiment of the present approach.

FIG. 4 is a schematic of an embodiment of a TDMOSFET device 70 that includes a trench 42 in addition to a non-planar surface geometry, in which one or more trench features are disposed substantially parallel (e.g., substantially aligned with) to the length ($L_{CH}$) of the channel region 28. In particular, FIG. 4 illustrates a TDMOSFET device 70, having a device profile 72 resembling the rectangular trenches features 76 that are oriented substantially parallel to the length of the channel region 28 ($L_{CH}$). As set forth in U.S. patent application Ser. Nos. 13/934,004 and 13/934,053, entitled, "METAL-OXIDE-SEMICONDUCTOR (MOS) DEVICES WITH INCREASED CHANNEL PERIPHERY AND METHODS OF MANUFACTURE", which are incorporated by reference herein in their entireties for all purposes, the non-planar surface of the illustrated TDMOSFET device 70 provides an increased effective surface area per device and per die that reduces resistance in the channel region 28 and decreases one or more contact resistances of the semiconductor device. For the illustrated TDMOSFET device 70, the trench 42 may be oriented substantially perpendicular (e.g., at approximately 90°) relative to the repeating rectangular peak features 74 and rectangular trenches features 76 of the non-planar surface. Additionally, it may be appreciated that, in other embodiments the TDMOSFET 70 illustrated in FIG. 4 may include the gate shield 56, the trench shield 62, or a combination thereof, depending on the dimensions of the TDMOSFET 70. It may also be appreciated that other non-planar surface profiles that increase the periphery of the channel region 28 (e.g., a triangular trench features, rounded trench features, trench features having other rectangular shapes, and so forth) and/or designs that orient the channel relative to particular crystallographic planes of the substrate (e.g., a (0 $33\bar{8}$) plane, a (11$\bar{2}$0) plane, or a (1$\bar{1}$00) plane of a 4H-/6H— SiC substrate) may also be useful in combination with the presently disclosed trench-gate design.

FIGS. 5A-D illustrate a simulated cross-sectional view of an embodiment of a TDMOSFET device 80 in four different states. FIG. 5A illustrates a simulated cross-sectional view of the TDMOSFET device 80 to illustrate the structure of the device. FIG. 5B illustrates a simulated cross-sectional view of the TDMOSFET device 80 in a blocking state. FIGS. 5C and 5D illustrate a simulated cross-sectional view of the TDMOSFET device 80 in an OFF state and an ON state, respectively. It may be appreciated that the TDMOSFET device 80 illustrated in FIGS. 5A-D includes a number of features introduced above, with respect to FIGS. 3 and 4.

Turning to FIG. 5A, the structure of the TDMOSFET device 80 is illustrated. FIG. 5A does not include markings denoting electric fields, potential contours, or current flowlines, as are illustrated in FIGS. 5B-D, such that the structure of the TDMOSFET device 80 may be clearly illustrated. The illustrated TDMOSFET device 80 in each of FIGS. 5A-D include a trench 42 that extends 2 μm into the JFET region 29 and is disposed near the channel region 28, which has a channel length ($L_{CH}$) of 0.15 μm. The JFET region 29 and the N-drift region 16 of the illustrated TDMOSFET device 80 are n-doped at approximately $1\times10^{15}$ cm$^{-3}$ and $5\times10^{15}$ cm$^{-3}$, respectively. Additionally, for the illustrated TDMOSFET device 80 the thickness of the gate dielectric 24 along the sidewall 46 of the trench 42 is 100 nm while the thickness along the bottom 48 of the trench 42 is 50 nm.

FIG. 5B illustrates the TDMOSFET device 80 in a blocking state, in which a large drain-source bias ($V_{DS}$) of 1200V is applied in the absence of a gate bias ($V_{GS}$=0V). As such, in addition to the components illustrated in FIG. 5A, FIG. 5B includes a number of contours 82, 84, 86, and 88, which represent the magnitude and position of the electric fields generated within the device during blocking. For example, contour 82 represents the strongest field strength (e.g., approximately 3 MV/cm), followed by contour 84 (e.g., approximately 2.5 MV/cm), contour 86 (e.g., approximately 2 MV/cm), and 88 (e.g., approximately 1 MV/cm). Beyond the edge of contour 88, the N-drift region 16 of the illustrated TDMOSFET device 80 experiences an electric field less than approximately 1 MV/cm. As such, the contours 82, 84, 86, and 88 illustrate the electric fields that, for other MOSFET devices, lead to DIBL effects. However, as illustrated in FIG. 5B, for the TDMOSFET device 80, the trench-gate 26, acting as a field plate and shield, protects the channel region 28 from the electric fields generated by the large $V_{DS}$. Accordingly, the trench-gate 26 of the illustrated TDMOSFET device 80 shields the electric fields represented by contours 82, 84, 86, and 88, thus preventing the high fields from reaching the channel region 28 and, thereby, largely or entirely preventing DIBL effects from limiting the BV of the device.

FIG. 5C illustrates the TDMOSFET device 80 in an OFF state, in which a drain-source bias ($V_{DS}$) of 1V is applied with $V_{GS}$=0V. Accordingly, FIG. 5C illustrates a number of potential contour lines 90 that demonstrate the potential distribution within the TDMOSFET device 80 in the OFF state. In particular, the contour line 91 represents the boundary of the depletion to the N-drift region 16 caused by the applied $V_{DS}$. However, the dimensions of the TDMOSFET device 80 (e.g., trench-gate 26) affects the distribution (e.g., the shape) of these contour lines 90 such that this depletion does not lead to the formation of a conductive pathway through the TDMOSFET device 80 in the OFF state (e.g., no significant voltage drop across the channel region to cause DIBL).

FIG. 5D illustrates the TDMOSFET device 80 in an ON state, in which a modest drain-source bias ($V_{DS}$) of 1V is applied in the presence of a gate bias ($V_{GS}$=15V). Accordingly, FIG. 5D illustrates a number of current flow lines 92 (e.g., dashed lines representing a total current flow of approximately 270 A/cm$^2$) that demonstrate various current paths through the TDMOSFET device 80 in the ON state. As illustrated in FIG. 5D, after traversing the channel region 28 along the surface of the semiconductor substrate, most of the current paths 92 follow along the sidewall 46 of the trench 42, following the accumulation layer 93 that forms when the $V_{GS}$ is greater than the flatband voltage of the sidewall Metal-Insulator-Semiconductor (MIS) structure. It may be appreciated the accumulation layer 93 induced by the gate 26 generally provides additional reduction of conduction losses compared to other types of MOSFET devices. For example, the accumulation layer 93 near the gate 26 enables the TDMOSFET device 80 to achieve better performance than UMOSFET devices. Further, it may be appreciated that the electric fields provided by the gate bias and experienced by the sidewall 46 of gate dielectric 24 may be less than approximately 5 MV/cm (e.g., less than 4 MV/cm, less than 2 MV/cm, less than 1.5 MV/cm). This electric field strength may be generally lower (e.g., weaker) than the electric field typically experienced by the gate dielectric sidewalls of certain UMOSFET devices, which may improve the reliability of the TDMOSFET device 80 relative to these UMOSFET devices.

FIG. 5E illustrates a simulated cross-sectional view of an embodiment of TDMOSFET device 40 in an ON state, in which a modest drain-source bias ($V_{DS}$) of 1V is applied in the presence of a gate bias ($V_{GS}$=15V). That is, the TDMOSFET device 40 is similar to the structure of the TDMOSFET device 80 illustrated in FIGS. 5A-D, but lacks the trench shield 62. FIG. 5E illustrates a number of current flow lines 94 (e.g., dashed lines representing a total current flow of approximately 350 A/cm$^2$) that demonstrate various current paths through the TDMOSFET device 40 in the ON state. As illustrated in FIG. 5E, after traversing the channel region along the surface of the semiconductor substrate, most of the current paths 94 follow along the sidewall of the trench, following the accumulation layer 93 that forms when the $V_{GS}$ is greater than the flatband voltage of the sidewall Metal-Insulator-Semiconductor (MIS) structure. It may be appreciated that, in certain embodiments, the TDMOSFET device 40 may be used in combination with a retrograde p-well 18 doping profile in which the surface doping concentration is lower than the dopant concentration some distance into the epitaxial semiconductor layer of the device.

FIG. 5F illustrates a simulated cross-sectional view of the embodiment of the TDMOSFET device 40 of FIG. 5E in a blocking state, in which a large drain-source bias ($V_{DS}$) of 1200V is applied in the absence of a gate bias ($V_{GS}$=0V). Note that certain features, such as the source contact 22, have been omitted in FIG. 5F to more clearly illustrate the various fields present in the illustrated TDMOSTFET device 40 during blocking state operation. As such, FIG. 5F includes a number of contours 95 which represent the magnitude and position of the electric fields generated within the device during blocking state operation. As illustrated in FIG. 5F, for the TDMOSFET device 40, the trench-gate 26, acting as a field plate and shield, protects the channel region from the electric fields generated by the large $V_{DS}$. This is further supported by the plot 96 illustrated in FIG. 5G, which illustrates the electric field as a function of distance when moving along the arrow 97 illustrated in FIG. 5F. For the embodiment of FIG. 5G, the dimensions of the device (e.g., dimensions 51, 44, 54, and 29, discussed above) are configured such that the electric fields at the gate dielectric 24 are sufficiently reduced without the use of the gate shield 56 or trench shield 62, representing a simpler device structure to fabricate. The plot 96 illustrated in FIG. 5G includes a curve 98 that demonstrates a maximum field strength of approximately 4 MV/cm near the gate dielectric 24. Accordingly, the trench-gate 26 of the illustrated TDMOSFET device 40 shields the electric fields generated during blocking state operation, thus preventing the high fields from reaching the channel region and, thereby, largely or entirely preventing DIBL effects from limiting the BV of the device.

FIG. 6 is a graph 100 illustrating simulated I-V characteristics for a typical planar DMOSFET device and for an embodiment of a TDMOSFET device (e.g., TDMOSFET devices 40 or 60) having nearly similar features (e.g., $L_{CH}$=0.3 μm; p-well doping=3.8×10$^{13}$ cm$^{-3}$; JFET width=2.6 μm (e.g., the distance between p-wells 18); N-drift layer thickness=11 μm; N-drift layer doping=9×10$^{15}$ cm$^{-3}$). In particular, the graph 100 illustrates drain leakage current density ($J_D$) as a function of drain-source bias ($V_{DS}$) and includes two curves: curve 102 and curve 104. The curve 102 represents leakage current density as a function of $V_{DS}$ for a planar DMOSFET (e.g., MOSFET 10 of FIG. 1). The curve 102 illustrates that, for a short channel planar DMOSFET, leakage current density increases in a substantially linear manner (in semi-log scale) with an applied $V_{DS}$ greater than approximately 500 V, indicating DIBL limited breakdown. In contrast, the curve 104 represents leakage current density as a function of $V_{DS}$ for a TDMOSFET device (e.g., TDMOSFET devices 40 or 60). Accordingly, the curve 104 demonstrate a substantially lower leakage current density when the applied $V_{DS}$ is greater than approximately 300 V, and avalanche limited breakdown voltage. Accordingly, the presently disclosed TDMOSFET device design enables substantially lower leakage current densities than planar DMOSFET devices, thus providing more room for design optimization (e.g., $L_{CH}$ reduction). Additionally, while the planar DMOSFET device represented by the curve 102 experiences channel leakage limited break down at 1.25 kV due to DIBL effects, the TDMOSFET device represented by the curve 104 exhibits avalanche breakdown at approximately 1.58 kV despite having the same substrate and channel design.

For the planar DMOSFET represented by the curve 102 in FIG. 6, a conventional solution to the channel leakage limited break down at 1.25 kV would be to reduce the JFET width and/or to increase the channel length ($L_{CH}$ 28) and/or doping to better shield the channel region from DIBL effects. However, this approach severely increases conduction losses at elevated temperature due to the strong positive temperature coefficient of the resistance in the JFET region ($R_{JFET}$). For example, FIG. 7 is a graph 110 that illustrates the simulated I-V ON-state characteristics of a planar DMOSFET (represented by the curve 112), a TDMOSFET device (e.g., TDMOSFET device 60, represented by curve 116) having the same pitch at the planar DMOSFET, and another TDMOSFET device having an optimized cell (represented by curve 116) (e.g., $V_{GS}$=20 V; $L_{CH}$=0.3 μm; temperature=150° C.). The planar DMOSFET represented by the curve 112 in the graph 110 has the same design as the planar DMOSFET represented by the curve 102 in FIG. 6; however, the width of the JFET region has been reduced to 1.8 μm to raise the blocking voltage to 1.5 kV. For the planar DMOSFET device represented by the curve 112, despite having a specific ON resistance ($R_{ON,sp}$) of 6.7 mΩ-cm² at 25° C., the $R_{ON,sp}$ increases to 11.2 mΩ-cm² (e.g., by approximately 67%) at 150° C. By comparison, for the TDMOSFET device represented by the curve 114, having the same pitch as the planar DMOSFET, the $R_{ON,sp}$ is approximately 6.9 mΩ-cm². Further, for the TDMOSFET device represented by the curve 116, having the optimized cell, the $R_{ON,sp}$ is further decreased to approximately 4.7 mΩ-cm². Accordingly, the presently disclosed TDMOSFET device design enables a lower $R_{ON,sp}$ than planar DMOSFET devices, even before further cell optimization.

Figure 9:
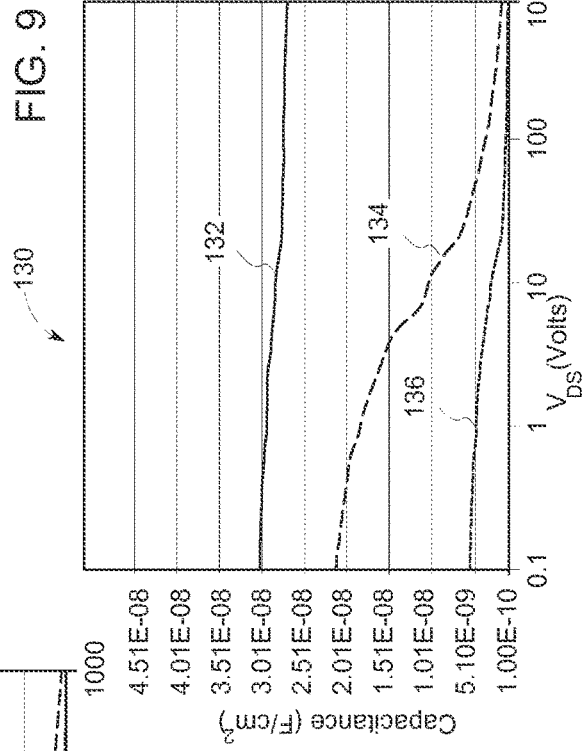
FIG. 9 is a graph illustrating graph illustrating simulated C-V characteristics (i.e., $C_{iss}$, $C_{oss}$, and $C_{rss}$ as a function of $V_{DS}$) for an embodiment of the TDMOSFET device.
Figure 8:
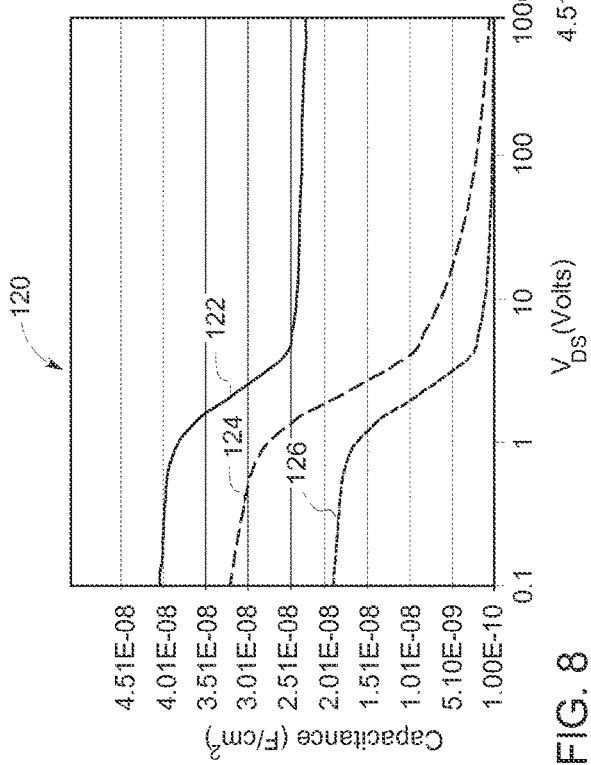
FIG. 8 is a graph illustrating simulated C-V characteristics (i.e., input capacitance ($C_{iss}$), output capacitance ($C_{oss}$), and reverse transfer capacitance ($C_{rss}$) normalized to area as a function of $V_{DS}$) for the planar MOSFET of FIG. 1.

As mentioned, the presently disclosed TDMOSFET design (e.g., TDMOSFET device 60) may also enable advantages in terms of providing devices having reduced capacitance. For example, in certain embodiments of the TDMOSFET design may include a gate dielectric 24 disposed within the trench 42 in which the dielectric disposed along the sidewall 46 and the bottom 48 of the trench 42 may be relatively thick (e.g., between approximately 50 nm and approximately 300 nm or between approximately 50 nm and approximately 100 nm), which may minimize the reverse transfer capacitance ($C_{rss}$) in the TDMOSFET device design. To better illustrate this effect, FIG. 8 is a graph 120 illustrating simulated C-V characteristics, namely input capacitance ($C_{iss}$) 122, output capacitance ($C_{oss}$) 124, and reverse transfer capacitance ($C_{rss}$) 126 as a function of $V_{DS}$, for a planar DMOSFET device (e.g., MOSFET 10 illustrated in FIG. 1). For comparison, FIG. 9 is a graph 130 illustrating simulated C-V characteristics, namely input capacitance ($C_{iss}$) 132, output capacitance ($C_{oss}$) 134, and reverse transfer capacitance ($C_{rss}$) 136 as a function of $V_{DS}$ for an embodiment of a TDMOSFET (e.g., TDMOSFET device 40 or 60). As shown in FIG. 9, unlike the planar DMOSFET illustrated in FIG. 8, the TDMOSFET device has an input capacitance ($C_{iss}$) less than approximately 3×10⁻⁸ Farads per square centimeter (F/cm²), an output capacitance less than approximately 2×10⁻⁸ F/cm², and a reverse transfer capacitance ($C_{rss}$) less than approximately 5×10⁻⁹ F/cm², even with $V_{DS}$ as low as 0.1 V. As such, the graph 130 illustrates that the TDMOSFET design not only reduces the on-resistance-capacitance product, but also minimizes the $C_{rss}$: $C_{oss}$, $C_{rss}$:$C_{iss}$ ratio, which is believed to enable faster switching transients by improving dV/dt "shoot through" immunity in half-bridge device configurations. It may be appreciated that, as used herein, "shoot through" may be used to refer to a condition in which the transient current flowing through the $C_{rss}$ of the device holds the device's gate potential above $V_t$, rendering both switches conductive across the DC bus.

Figure 10:
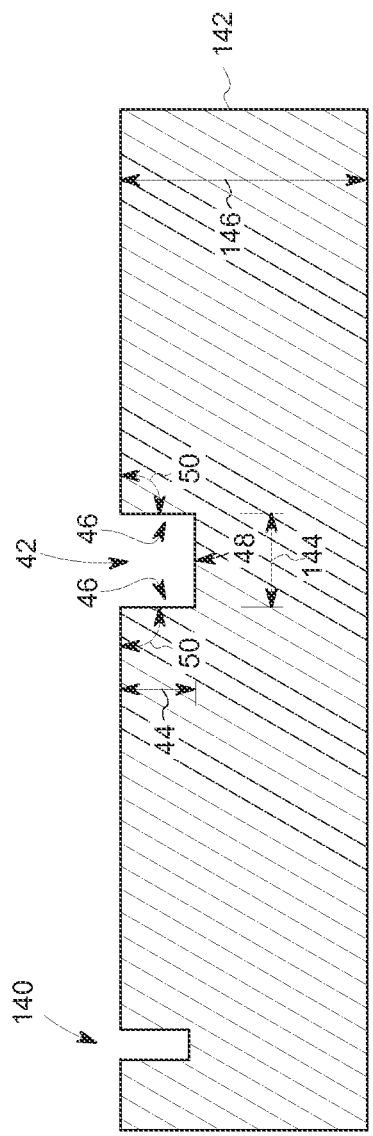
FIG. 10 is a schematic illustrating a semiconductor substrate with an epitaxial layer after trench etching during the manufacture of an embodiment of a TDMOSFET device.

FIGS. 10-14 illustrate an embodiment of a process whereby an embodiment of the TDMOSFET 60 may be manufactured. It should be appreciated that, for FIGS. 10-14, certain commonly understood design elements (e.g., top metallization, passivation, edge termination, and so forth) may be omitted in order to focus on specific details of the presently disclosed trench-gate MOSFET design. As illustrated in FIG. 10, in certain embodiments, the manufacturing process may begin with etching the trench 42 as well as the primary mark 140 into the surface of an epitaxial semiconductor layer 142 (e.g., a SiC epitaxial semiconductor layer). It may be appreciated the bottom portion of this epitaxial semiconductor layer 142 will serve as the N-drift layer 16 (e.g., having a dopant concentration of between approximately 1×10¹⁵ cm⁻³ and approximately 5×10¹⁶ cm⁻³), while the upper portion will be modified by subsequent dopant implantation steps to form other portions (e.g., p-well 18, n+ region 20, and so forth) of the TDMOSFET device 60. Accordingly, for the epitaxial semiconductor layer 142 of the TDMOSFET device being manufactured, in certain embodiments, the surface may be lightly N-doped (e.g., less than the N-drift layer 16, between approximately 10% and approximately 50% or between approximately 10% and 20% of the doping of the N-drift layer 16). This is lower than the surface doping of the epitaxial semiconductor layer (e.g., the JFET region 29) for manufacturing a typical MOSFET device in which the surface doping is greater than or equal to the doping of the underlying N-drift layer (e.g., up to approximately 10× the doping of the N-drift layer). For example, in an embodiment of the TDMOSFET device 60, the channel region 28 may have a dopant concentration of less than approximately 1×10¹⁷ cm⁻³, but higher in that the dopant concentration within the epitaxial layer 142.

It may be appreciated that this lighter surface doping of the epitaxial layer 142 used to manufacture the TDMOSFET device 60 may improve ON state, blocking, and switching conditions for the TDMOSFET device 60, as discussed above. It may also be appreciated that the TDMOSTFET device 60 may additionally or alternatively include a thicker (e.g., 150 nm) dielectric layer 24 disposed along the sidewall 46 and the bottom 48 of the trench 42. It may further be appreciated that a number of dimensions may be controlled when forming the trench 42 in the epitaxial semiconductor layer 142. For example, as discussed above, the depth 44 of the trench 42 and the angle 50 between the sidewalls 46 and the bottom 48 of the trench 42 may be controlled to modulate the size and shape of the trench 42. Additionally, it may also be desirable to minimize the width 144 of the trench 42 as well as the thickness 146 of the epitaxial semiconductor layer 142 relative to the depth 44 of the trench 42 to further control the electrical properties of the resulting TDMOSFET device 60.

Figure 11:
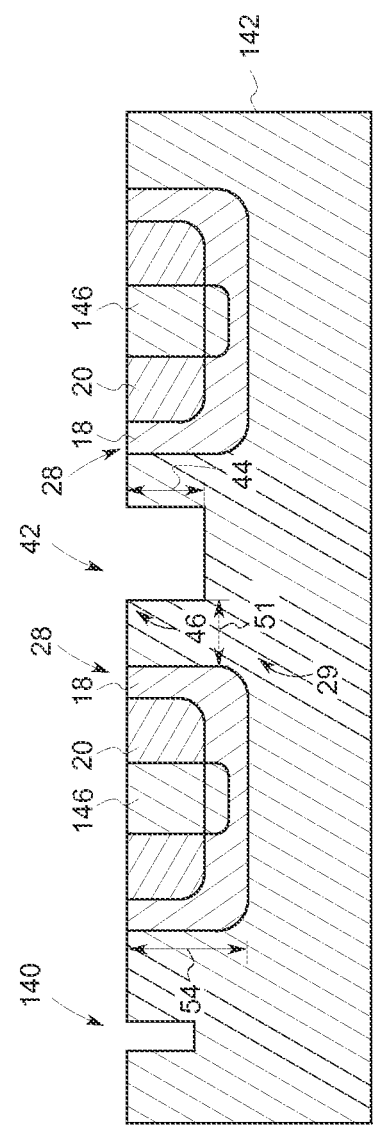
FIG. 11 is a schematic illustrating the semiconductor substrate of FIG. 10 after dopant implantation steps to form a p-well, a n+ region, and a P+ body contact region.

FIG. 11 illustrates the epitaxial semiconductor layer 142 of FIG. 10 after a number of implantation steps have been completed. For example, the epitaxial semiconductor layer 142 may undergo a number of ion implantation steps (e.g., two or more) in order to form the p-well 18, the n+ region 20, and a P+ body implant 146 in the surface of the epitaxial semiconductor layer 142. It should be appreciated that, in certain embodiments, other common semiconductor features, such as field stops and/or edge termination, may also be added to the surface of the epitaxial semiconductor layer 142. It should also be appreciated that any number of photolithographic masking steps may be performed between certain ion implantation steps to control the resulting position and concentration of the dopants in the epitaxial semiconductor surface, as commonly understood in the art. It may be appreciated that using the aforementioned epitaxial semiconductor layer 142 that initial has a lower surface doping enables the use of less dopant to form the channel region (e.g., the p-channel region 28 doped at approximately $1 \times 10^{16}$ cm$^{-3}$) and the well region 18, which may enable higher mobility and improved transconductance in the TDMOSFET device 60 as well as reduce $R_{ON,sp}$ by allowing shorter channel lengths ($L_{CH}$). In addition to the depth 54 of the p-well 18, which, in certain embodiments, may be selected relative to the depth 44 of the trench 42, it may also be desirable to control the distance 51 between the p-well 18 and the sidewall 46 of the trench 42 (e.g., the width 51 of the JFET region 29). It should be appreciated that this distance 51 largely determines the distance between the trench-gate 26 in the channel region 28 of the resulting TDMOSFET 60 and, thereby, affects the electrical properties of the resulting TDMOSFET device 60.

Figure 12:
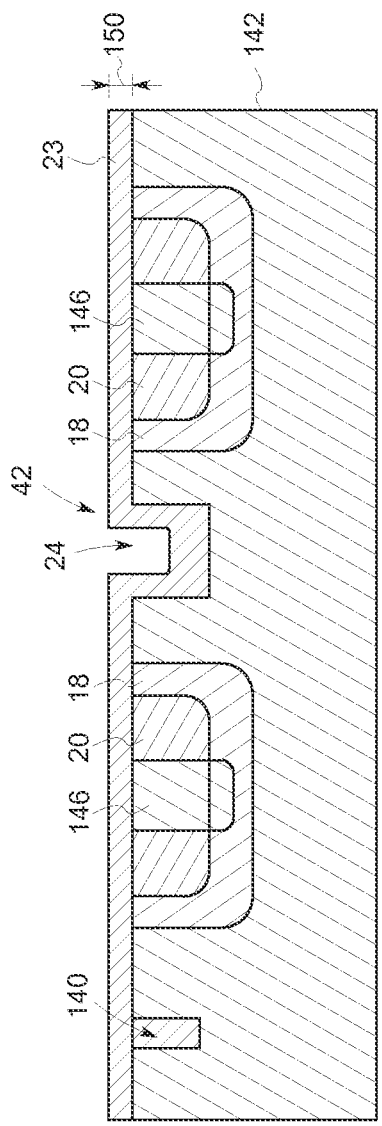
FIG. 12 is a schematic illustrating the semiconductor substrate of FIG. 11 after forming a gate dielectric layer.

FIG. 12 illustrates the epitaxial semiconductor layer 142 of FIG. 11 after forming the gate dielectric layer 24 over the surface of the epitaxial semiconductor layer 142. As illustrated in FIG. 12, the gate dielectric layer 24 may initially fill the entire trench 24 and extend above the surface of the epitaxial semiconductor layer 142 a distance 150. Subsequently, a portion of the gate dielectric layer 24 occupying the trench 24 may be selectively removed (e.g., using common masking and etching procedures) to enable the gate 26 to extend into the trench 42, as discussed below. In other embodiments, the trench 24 may not be completely filled and etched, but rather, the trench 24 may instead be partially filled by a conformal gate dielectric layer 24, and the gate 26 may subsequently be deposited into the depression in the gate dielectric layer 24 that forms along the trench 42. This may result in the gate 26 having the non-planar top surface, as indicated by the dashed line 45 in FIG. 2.

Figure 13:
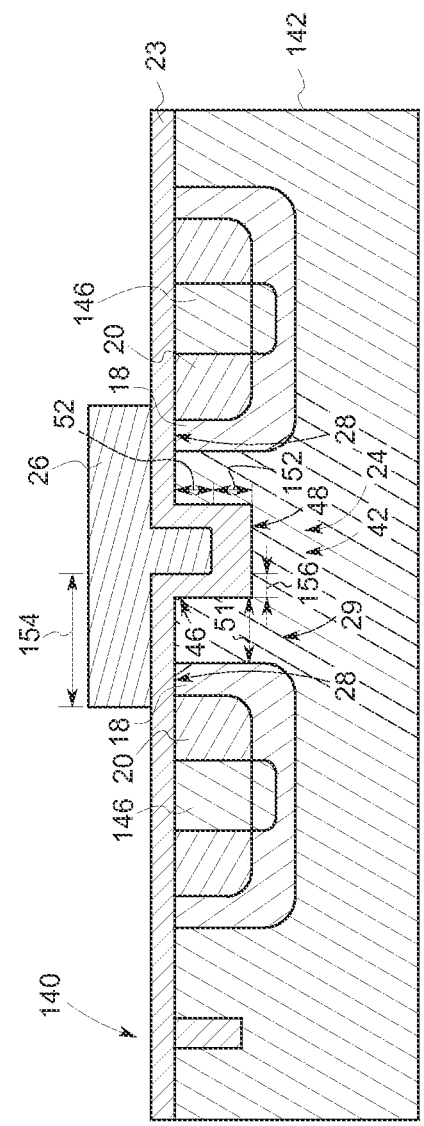
FIG. 13 is a schematic illustrating the semiconductor substrate of FIG. 12 after gate contact formation.

FIG. 13 illustrates the epitaxial semiconductor layer 142 of FIG. 12 after the gate dielectric layer 24 and the gate 26 have been formed. As illustrated in FIG. 13, the gate 26 is deposited on top of the gate dielectric 24, extending over at least the channel region 28 and extending a depth 52 into the trench 42. It may be appreciated that, the depth 52 that the gate 26 extends into the trench 42 may be generally controlled by a thickness 152 of the gate dielectric layer 24 that is disposed along the bottom 48 of the trench 42. Further, it may be appreciated that the distance 154, which spans a portion of the gate 26 that extends into the trench 42, the channel region 28, and n+ overlap portion of 20, may be affected by both the width 51 of the JFET region 29 and the thickness 156 of the gate dielectric layer 24 that is disposed along the sidewall 46 of the trench 42. In certain embodiments, the thicknesses 152 and 156 of the gate dielectric layer 24 may be the same (e.g., 150 nm), while in other embodiments, thickness 152 or thickness 156 may be greater.

Figure 14:
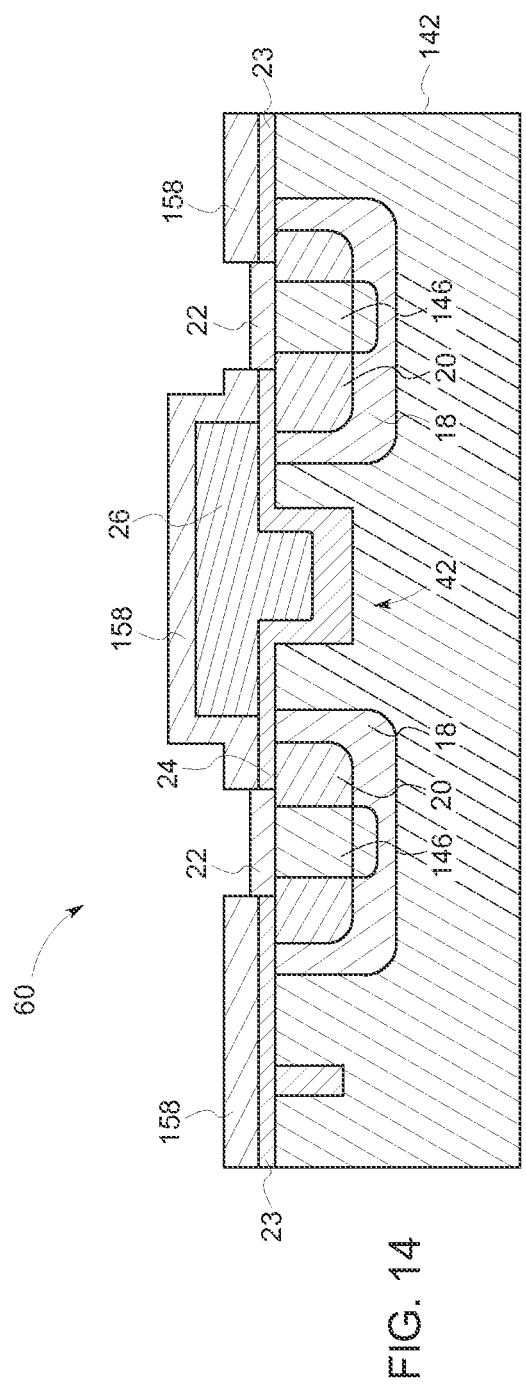
FIG. 14 is a schematic illustrating the semiconductor substrate of FIG. 13 after forming an interlevel dielectric layer and forming the source contacts.

FIG. 14 illustrates the epitaxial semiconductor layer 142 of FIG. 13 after forming the interlayer dielectric 158 over the gate 26 and depositing the source contacts 22. For example, the interlayer dielectric 158 may first be deposited over the surface of the epitaxial semiconductor layer 142, and then portion of the interlayer dielectric 158 as well as the gate dielectric layer 24 may be selectively removed over portions of the n+ regions 20. Then, the source contacts 22 may be deposited over the exposed portions of the surface of the epitaxial semiconductor layer 142. As mentioned above, it may be appreciated that, in certain embodiments, additional commonly utilized process steps may be performed (e.g., pad metal deposition backmetal deposition, passivation, polyimide deposition, and so forth) to complete the manufacture of TDMOSFET device 60.

Technical effects of the invention include a trench-gate DMOSFET (TDMOSFET) design that affords performance and reliability advantages compared to conventional planar DMOSFET as well as UMOSFET devices. In particular, present embodiments enable reduced DIBL effects, even for the shortest channel lengths available by currently process technology. Further, the presently disclosed TDMOSFET designs enable lower leakage currents at elevated temperatures and the use of lower gate-drive voltages. For example, the presently disclosed TDMOSFET design embodiments are capable of reducing the on-resistance of typical planar DMOSFET devices by 2-3× at operating temperatures greater than 150° C. Additionally, present embodiments enable a lower capacitance semiconductor device, providing improved transient characteristics when compared to certain planar DMOSFET devices. Additionally, the presently disclosed TDMOSFET design may be used in combination with certain non-planar device designs having repeating trench structures oriented generally orthogonal to $L_{CH}$ for additional reduction in $R_{ON,sp}$. It may be appreciated that the present technique may be applicable to other types of structures and layers, such as stripe layouts, ladder layouts, and various cellular layouts (e.g., square cellular layout, hexagonal cellular layout, and so forth).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A semiconductor device, comprising:
    a well region extending a first depth into a surface of an epitaxial semiconductor layer positioned above a drift region;
    a junction field-effect transistor (JFET) region positioned adjacent to the well region in the epitaxial semiconductor layer;
    a trench extending a second depth into the JFET region, wherein the trench comprises a bottom and a sidewall that extends down to the bottom at an angle relative to the surface of the epitaxial semiconductor layer;
    a gate dielectric layer comprising a first portion disposed along the sidewall and the bottom of the trench and having a first thickness, a second portion disposed on top of a portion of the well region and having a second thickness, and a third portion disposed adjacent to a source contact and having a third thickness; and a gate electrode disposed over the gate dielectric layer and extending a third depth into the trench feature; and a channel region disposed in an upper portion of the well region, directly below the second portion of the gate dielectric layer, and below a portion of the gate electrode, wherein the channel region comprises a dopant concentration less than approximately $1 \times 10^{17}$ cm$^{-3}$, wherein the first thickness is two to ten times greater than the second thickness.

2. The semiconductor device of claim 1, wherein the gate electrode comprises a non-planar top surface.

3. The semiconductor device of claim 1, wherein the third thickness is at least 20% greater than the second thickness.

4. The semiconductor device of claim 1, comprising a trench shield disposed adjacent to the well region.

5. The semiconductor device of claim 1, comprising a gate shield region disposed in the bottom of the trench, wherein the gate shield region comprises a dopant type that that is opposite to a doping type of the drift region, and wherein the gate shield region comprises a sheet dopant concentration of less than approximately $1 \times 10^{13}$ cm$^{-2}$.

6. The semiconductor device of claim 1, wherein the semiconductor device has a channel length of 0.5 µm or less.

7. The semiconductor device of claim 1, wherein the first depth and the second depth are approximately equal.

8. The semiconductor device of claim 1, wherein the angle is between approximately 70 degrees and 135 degrees.

9. The semiconductor device of claim 1, wherein the angle is approximately 90 degrees.

10. The semiconductor device of claim 1, wherein the angle is configured to vary along a length of the sidewall to yield a curved sidewall.

11. The semiconductor device of claim 1, wherein the epitaxial semiconductor surface comprises a plurality of repeating trench features that are oriented substantially parallel to a length of a channel region of the semiconductor device.

12. The semiconductor device of claim 1, wherein the semiconductor device is a SiC semiconductor device.

13. The semiconductor device of claim 1, wherein the JFET region has a surface dopant concentration that is between approximately 10% and approximately 20% a dopant concentration of the drift region.

14. A semiconductor device, comprising:
a trench extending a depth into a junction field-effect transistor (JFET) region of an epitaxial semiconductor layer of the semiconductor device, wherein the trench comprises a sidewall that extends down from a surface of the epitaxial layer at a constant or variable angle, and wherein at least a portion of the sidewall of the trench are configured to accumulate carriers when the semiconductor device is in an ON-state;

a dielectric layer comprising
a first portion disposed along the sidewall and the bottom of the trench and having a first thickness, and
a second portion disposed on top of a portion of the well region and having a second thickness;

a gate electrode positioned on top of the dielectric layer and at least partially extending into the trench; and a channel region positioned near the trench, wherein the trench and the gate electrode are configured to shield the channel region from drain-induced barrier lowering (DIBL) effects when the semiconductor device is in a blocking state, wherein the semiconductor device is configured to maintain an electric field strength near the dielectric layer during OFF-state operation of the semiconductor device that is less than 50% of an electric field strength which induces break-down of the dielectric layer, wherein the first thickness is two to ten times greater than the second thickness.

15. The semiconductor device of claim 14, wherein the dielectric layer has a thickness of approximately 30 nm or more.

16. The semiconductor device of claim 14, wherein an input capacitance ($C_{iss}$) to reverse transfer capacitance ($C_{rss}$) ratio and a output capacitance ($C_{oss}$) to $C_{rss}$ ratio of the semiconductor device is greater than 2 with a drain-source bias ($V_{DS}$) of approximately 100V or less.

17. The semiconductor device of claim 14, wherein the semiconductor device is configured to radiation hardened against single event gate rupture failures.

18. The semiconductor device of claim 17, wherein the dielectric layer has a thickness between approximately 30 nm and approximately 500 nm.

* * * * *